United States Patent
Zhou

(10) Patent No.: US 10,714,613 B2
(45) Date of Patent: Jul. 14, 2020

(54) SEMICONDUCTOR DEVICE

(71) Applicants: Semiconductor Manufacturing International (Beijing) Corporation, Beijing (CN); Semiconductor Manufacturing International (Shanghai) Corporation, Shanghai (CN)

(72) Inventor: Fei Zhou, Shanghai (CN)

(73) Assignees: Semiconductor Manufacturing International (Beijing) Corporation, Beijing (CN); Semiconductor Manufacturing International (Shanghai) Corporation, Shanghai (CN)

(*) Notice: Subject to any disclaimer, the term of this patent is extended or adjusted under 35 U.S.C. 154(b) by 110 days.

(21) Appl. No.: 15/810,571

(22) Filed: Nov. 13, 2017

(65) Prior Publication Data

US 2018/0069122 A1    Mar. 8, 2018

Related U.S. Application Data

(62) Division of application No. 15/242,562, filed on Aug. 21, 2016, now Pat. No. 9,847,419.

(30) Foreign Application Priority Data

Oct. 28, 2015  (CN) .......................... 2015 1 0713879

(51) Int. Cl.
*H01L 29/78*  (2006.01)
*H01L 29/66*  (2006.01)

(52) U.S. Cl.
CPC .... *H01L 29/7848* (2013.01); *H01L 29/66545* (2013.01); *H01L 29/66636* (2013.01);
(Continued)

(58) Field of Classification Search
CPC .......... H01L 29/7848; H01L 29/66795; H01L 29/785
See application file for complete search history.

(56) References Cited

U.S. PATENT DOCUMENTS 8,350,253 B1  1/2013  Zhu et al.
2012/0091539 A1  4/2012  Fan
(Continued)

FOREIGN PATENT DOCUMENTS

| CN | 103219340 A | 7/2013 |
| CN | 104051270 A | 9/2014 |
| DE | 102012105738 A1 | 7/2013 |

*Primary Examiner* — Amar Movva
(74) *Attorney, Agent, or Firm* — Anova Law Group, PLLC

(57) ABSTRACT

The present disclosure provides a fabrication method for forming a semiconductor device, including: forming a substrate, the substrate including first fins, second fins, and a first trench located in the substrate between a first fin and an adjacent fin; forming a first mask layer on the substrate, the first fins, and the second fins; and removing portions of the first mask layer neighboring a first trench to expose a portion of a top surface of a first fin and a portion of a top surface of the adjacent second fin to form a first opening, a portion of the top surface of the first fin covered by a remaining portion of the first mask layer being a first fin device region, a portion of the top surface of the second fin covered by a remaining portion of the first mask layer being a second fin device region.

18 Claims, 11 Drawing Sheets

(52) U.S. Cl.
CPC ...... *H01L 29/66795* (2013.01); *H01L 29/785* (2013.01); *H01L 29/7853* (2013.01)

(56) References Cited

U.S. PATENT DOCUMENTS

| | | |
|---|---|---|
| 2013/0175640 A1* | 7/2013 | Illgen ...................... H01L 29/78 257/402 |
| 2014/0151810 A1 | 6/2014 | Maeda |
| 2014/0264572 A1 | 9/2014 | Kim |
| 2015/0035061 A1 | 2/2015 | Yoon et al. |
| 2015/0054089 A1 | 2/2015 | Hong et al. |
| 2015/0294969 A1* | 10/2015 | Lee ..................... H01L 27/0886 257/401 |

\* cited by examiner

SEMICONDUCTOR DEVICE

CROSS-REFERENCES TO RELATED APPLICATIONS

This application is a divisional of U.S. patent application Ser. No. 15/242,562, filed on Aug. 21, 2016, which claims the priority of Chinese patent application No. 201510713879.9, filed on Oct. 28, 2015, the entire content of all of which is incorporated herein by reference.

FIELD OF THE DISCLOSURE

The present disclosure relates to the field of semiconductor technology and, more particularly, relates to a semiconductor device and a fabrication method for forming the semiconductor device.

BACKGROUND

As the fabrication technology of semiconductor devices advances, semiconductor devices are having higher device density and higher level of integration. Being a basic type of semiconductor device, transistors are widely used. Higher device density and higher level of integration causes gate electrodes of planar transistors to have smaller dimensions. As a result, traditional planar transistors have weaker control of channel current, and the short channel effect often occurs. Thus, leakage current can be generated, and the electrical properties of the semiconductor devices are adversely affected.

Currently, to overcome the short channel effect and to suppress leakage current, fin field effect transistors (FinFETs) are used. As a common multi-gated device, a FinFET often includes a fin and a dielectric layer on the semiconductor substrate. The dielectric layer covers a portion of a sidewall of a fin. The surface of the dielectric layer is lower than the top surface of the fin. The FinFET also includes a gate structure. The gate structure is often disposed on the dielectric layer and the top surface and the sidewalls of the fin. The FinFET also includes a source and drain region, located in the fin on the two sides of the gate structure.

The source and the drain region, located in the fins on the two sides of a gate structure, is referred as a raised source and drain region. As the dimensions of the semiconductor devices shrink, it is becoming more difficult to form the raised source and drain region in a FinFET. In addition, a source and drain region formed in a stress layer often has impaired properties.

The disclosed semiconductor device and fabrication method are directed to solve one or more problems set forth above and other problems.

BRIEF SUMMARY OF THE DISCLOSURE

One aspect of the present disclosure provides a fabrication method for forming a semiconductor device, including: forming a substrate, the substrate including first fins, second fins, and a first trench located in the substrate between a first fin and an adjacent fin, a first fin being parallel to an adjacent second fin; forming a first mask layer on the substrate, the first fins, and the second fins; and removing portions of the first mask layer neighboring a first trench to expose a portion of a top surface of a first fin and a portion of a top surface of the adjacent second fin to form a first opening, a portion of the top surface of the first fin covered by a remaining portion of the first mask layer being a first fin device region, a portion of the top surface of the second fin covered by a remaining portion of the first mask layer being a second fin device region. The fabrication method also includes forming first insulating structures, a first insulating structure filling a first trench and a corresponding first opening, a first insulating structure covering a portion of the top surface of a first fin and a portion of the top surface of the adjacent second fin; forming a dummy gate structure on each first insulating structure, and a gate structure on each of the first fin device regions and the second fin device regions; and forming a stress layer in a first fin device region between a dummy gate structure and a gate structure and forming a stress layer in a second fin device region between a dummy gate structure and a gate structure.

Another aspect of the present disclosure provides a semiconductor device, including: a substrate, the substrate including first fins and second fins, a first fin being adjacent to a second fin; a first insulating structure located between a first fin and an adjacent second fin, the first insulating structure covering a portion of a top surface of the first fin and a portion of a top surface of the adjacent second fin, a portion of the first fin not covered by the first insulating structure being a first fin device region and a portion of the second fin not covered by the first insulating structure being a second fin device region; a dummy gate structure on a first insulating structure, and a gate structure on each of the first fin device region and the second fin device region; and a stress layer in a first fin device region between a dummy gate structure and a gate structure, and a stress layer in a second fin device region between a dummy gate structure and a gate structure.

Other aspects or embodiments of the present disclosure can be understood by those skilled in the art in light of the description, the claims, and the drawings of the present disclosure

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention.

Under the conventional techniques, as the dimensions of the semiconductor devices shrink, it is becoming more difficult to form the raised source and drain region in a FinFET. In addition, a source and drain region formed in a stress layer often has impaired properties.

The difficulty to fabricate raised source and drain regions in conventional semiconductor fabrication processes are described as follows. It should be noted that, in the present disclosure, for illustrative purposes, the source region and the drain region may be referred together, e.g., the source and drain region, or be described separately, e.g., the source region and the drain region.

Figure 1:
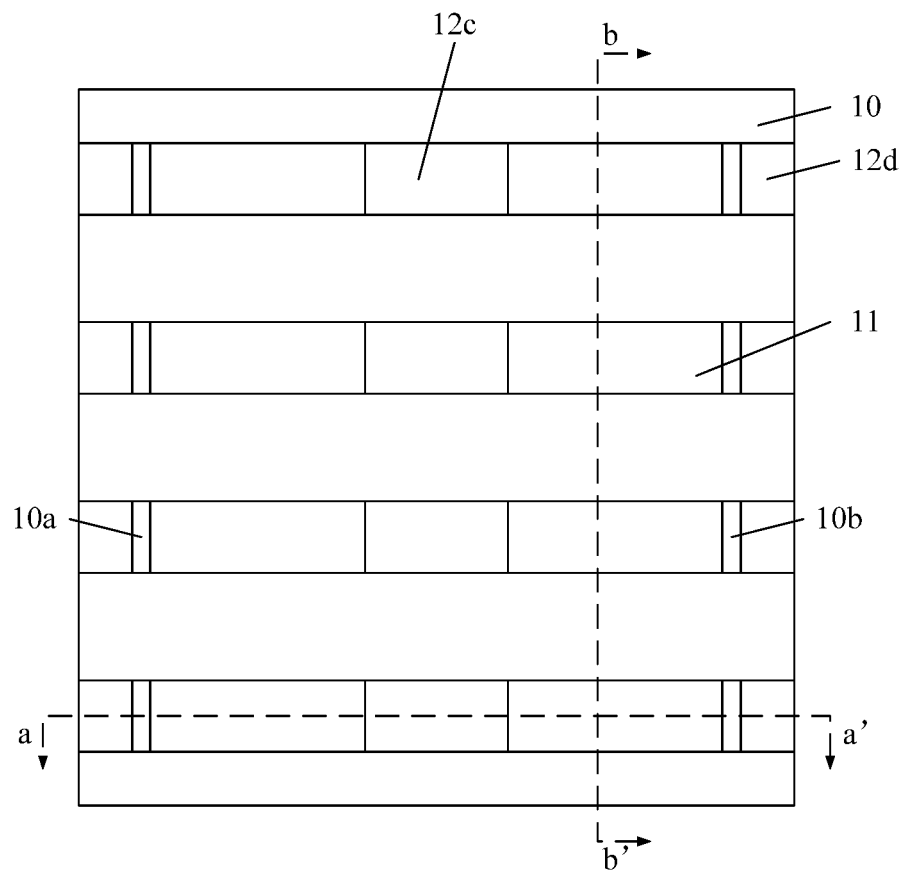
FIGS. 1-6 illustrate cross-sectional views of a semiconductor device corresponding to certain stages in a conventional semiconductor fabrication process.
Figure 2:
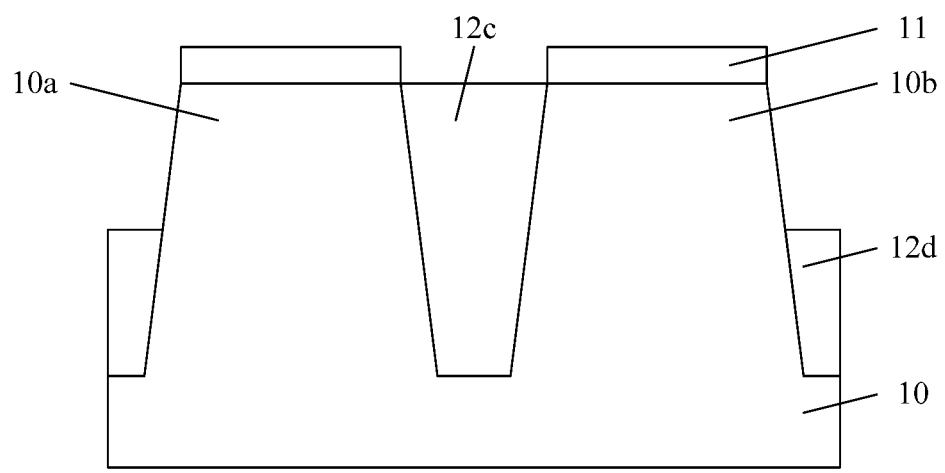
Figure 3:
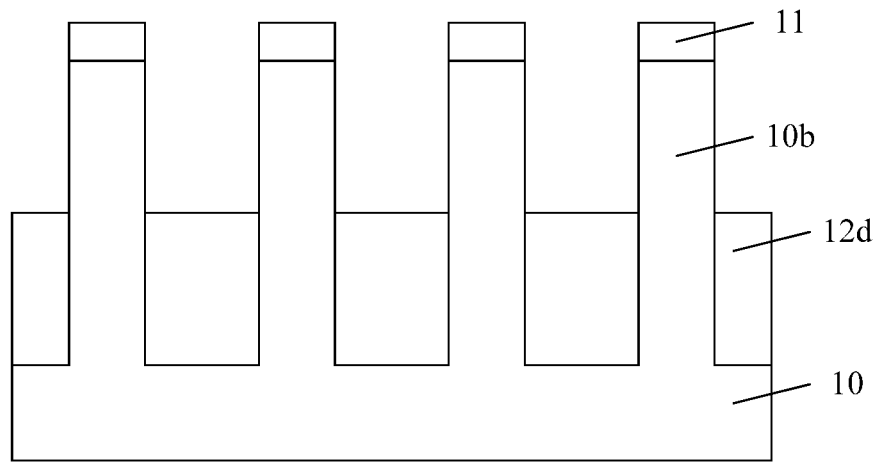

As shown in FIGS. 1-6, the cross-sectional views of the structure of a semiconductor device in a conventional semiconductor fabrication process are shown. FIG. 2 is a cross-sectional view of the semiconductor device along the a-a' direction in FIG. 1, and FIG. 3 is a cross-sectional view of the semiconductor device along the b-b' direction in FIG. 1.

Referring to FIGS. 1-3, a substrate 10 is formed. The substrate 10 includes first fins 10a and second fins 10b. A first mask 11 is formed to cover the first fins 10a and the second fins 10b. A first insulating structure 12c is formed between a first fin 10a and a corresponding/adjacent second fin 10b. The surface of a first insulating structures 12 is coplanar with the top surfaces of the first fins 10a and the second fins 10b. Second insulating structures 12d are formed on both sides of a first fin 10a and the corresponding second fin 10b. The top surfaces of the second insulating structures 12d are lower than the top surfaces of the first fins 10a and the second fins 10b.

Figure 4:
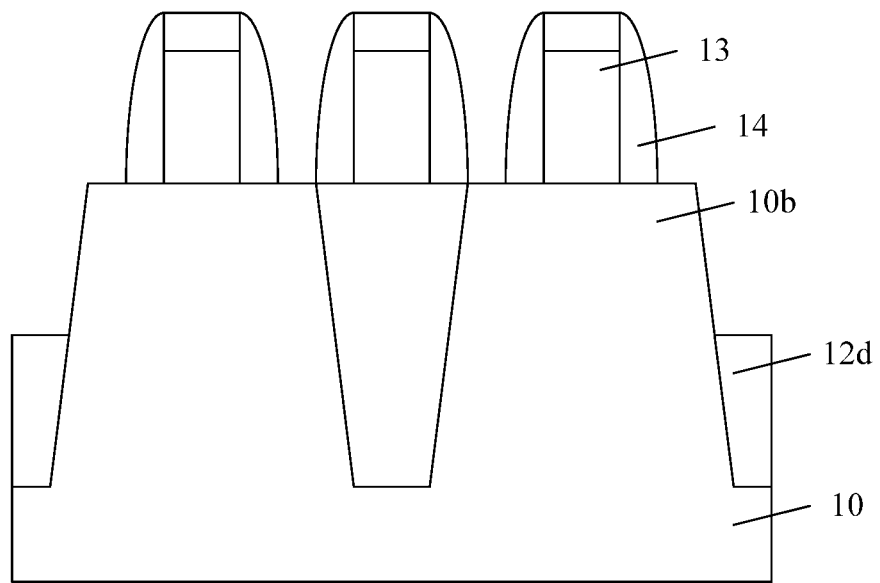

As shown in FIG. 4, the first mask 11 (shown in FIG. 3) on the first fins 10a and the second fins 10b may be removed. Dummy gate structures 13 may be formed on the first fins 10a, the second fins 10b, and the first insulating structures 12c.

Figure 5:
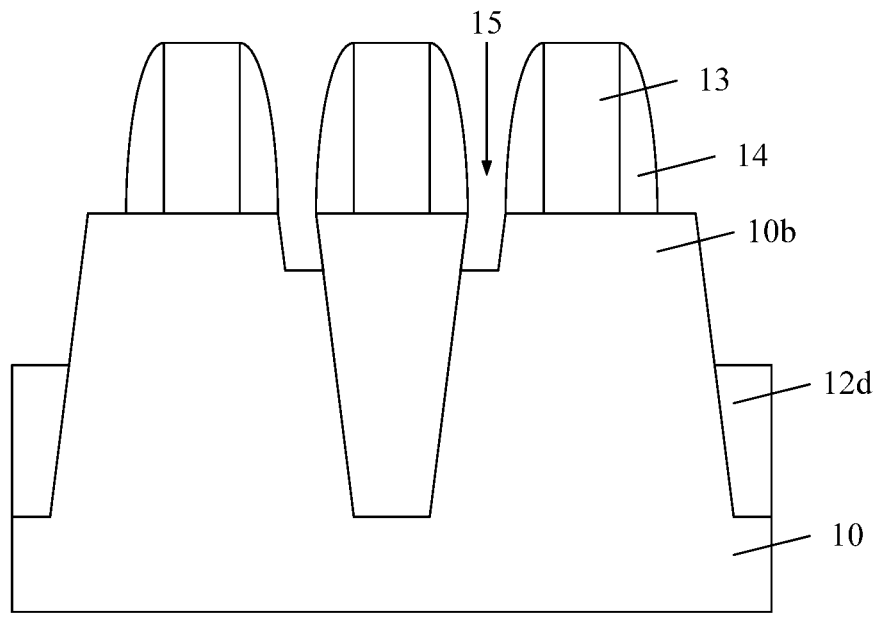

As shown in FIG. 5, sidewall spacers 14 are formed on the two sides of a dummy gate structure 13. Meanwhile, trenches 15 may be formed in the active regions of the fins (10a and 10b) on the two sides of a dummy gate structure 13. A trench 15 is used to form a source region or a drain region of a transistor.

Figure 6:
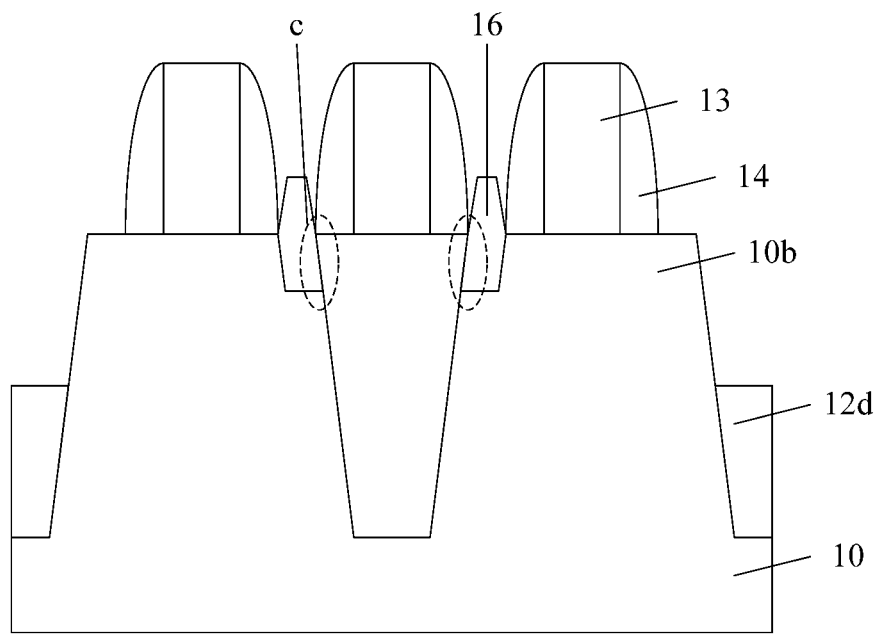

As shown in FIG. 6, a semiconductor material is filled in the trenches 15 to form stress layers 16.

Accordingly, a dummy gate structure 13 is formed on a first insulating structure 12c, and sidewall spacers 14 are formed on the two sides of the dummy gate structure 13 to cover the edges of the active regions in the fins (10a and 10b). In this way, the edges of the active regions would not be damaged when the trenches 15 are being formed.

However, in such semiconductor fabrication process, the dummy gate structure 13 formed on a first insulating structure 12c and the sidewall spacers formed on the two sides of the dummy gate structure 13 are not able to fully cover the edges of the active regions in the fins (10a and 10b). As a result, when the trenches 15 are subsequently formed in the fins (10a and 10b), the edges of the active regions are damaged, illustrated by the circle c in FIG. 6, and the shape and morphology of a trench 15 would be adversely affected. The properties of the stress layers formed in the trenches 15 may be affected accordingly. The performance of the subsequently-formed FinFETs can be impaired.

To solve the technical issues described above, one aspect of the present disclosure provides an improved fabrication method for forming a semiconductor device.

According to the disclosed fabrication method, first fins and adjacent second fins are formed on the substrate. A first trench is formed between a first fin and the adjacent/corresponding second fin. A first mask layer is formed on the top surfaces of the first fins and the second fins. Portions of the first mask layer neighboring a first trench may be removed to form a first opening, the first opening exposing a portion of a first fin and a portion of a second fin. The portion of a first fin not covered by the remaining portions of the first mask layer may be a first fin device region. The portion of a second fin not covered by the remaining portions of the first mask layer may be a second fin device region. A first insulating structure may be formed to fill in the first trenches and the corresponding first openings. A dummy gate structure may be formed on the first insulating structure. A gate structure may be formed on each of the first fin device region and the second fin device region. A stress layer may be formed in the first fin device region and in the second fin device region between a dummy gate structure and a gate structure.

Further, portions of the first mask layer neighboring the first trench may be removed to form a first opening, the first opening exposing a portion of the first fin and a portion of the second fin. The first trench and the corresponding first opening may be filled to form the first insulating structure. Thus, the first insulating structure not only provides electric insulation between the first fin and the second fin, but also covers a portion of the top surface of the first fin and a portion of the top surface of the second fin. The top surfaces of the first fin and the second fin neighboring the first trench would not be damaged when the stress layers are being formed. The shape and morphology of the shape layer can be improved, and the fabrication yield of the semiconductor device may be improved.

Figure 20:
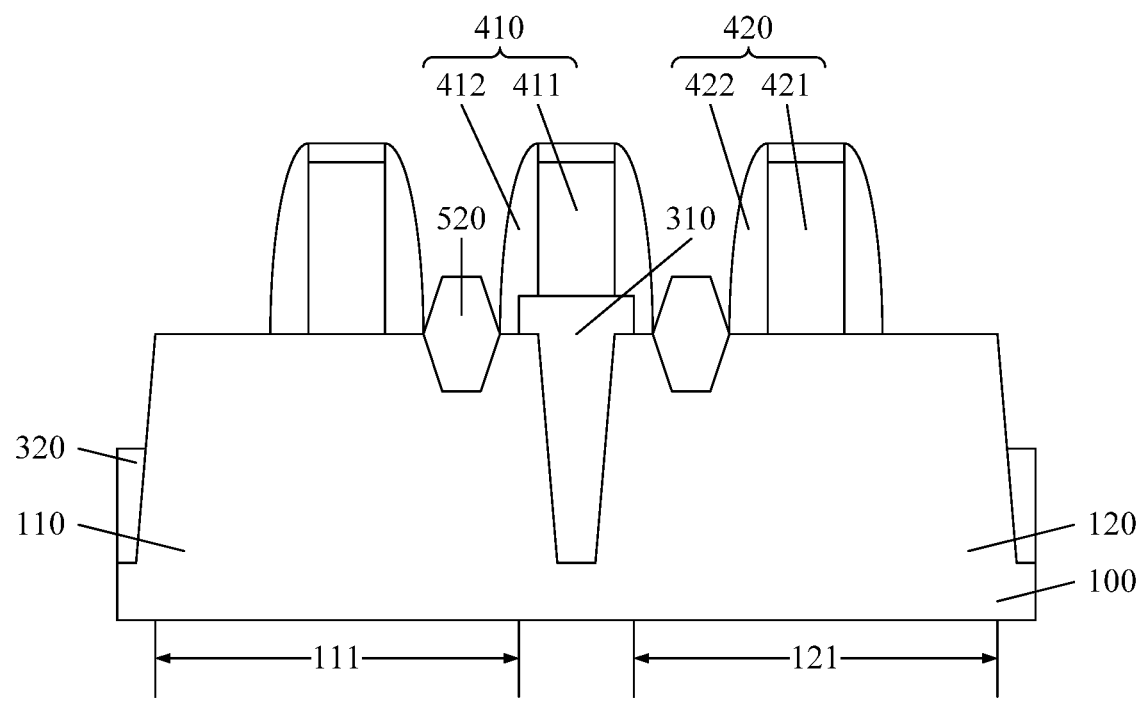
Figure 21:
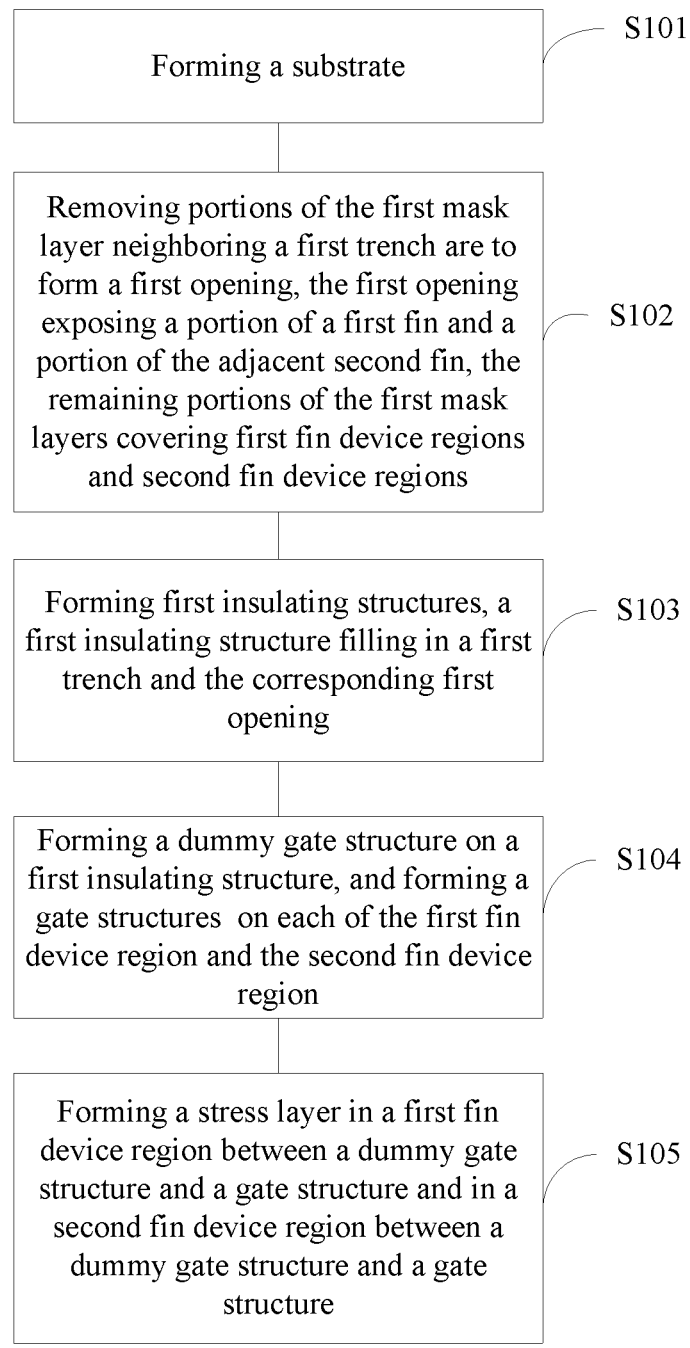
FIG. 21 illustrates an exemplary fabrication process for forming a semiconductor device consistent with various disclosed embodiments.

FIG. 21 illustrates an exemplary fabrication process of a semiconductor device and FIGS. 7-20 illustrate an exemplary semiconductor device corresponding to various stages of an exemplary fabrication process.

Figure 8:
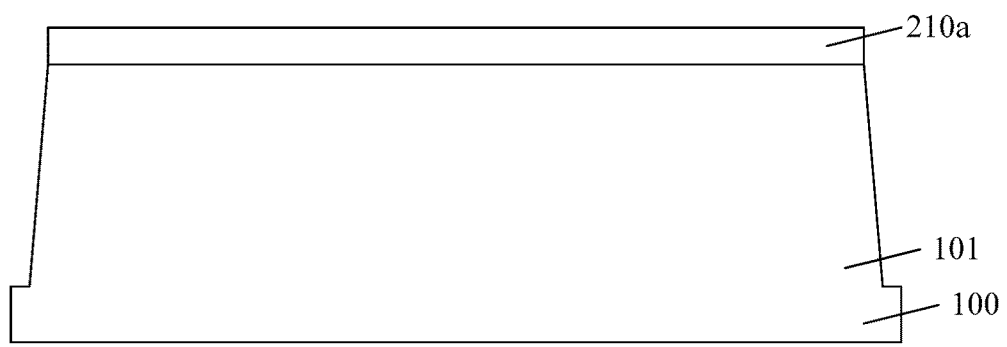
Figure 9:
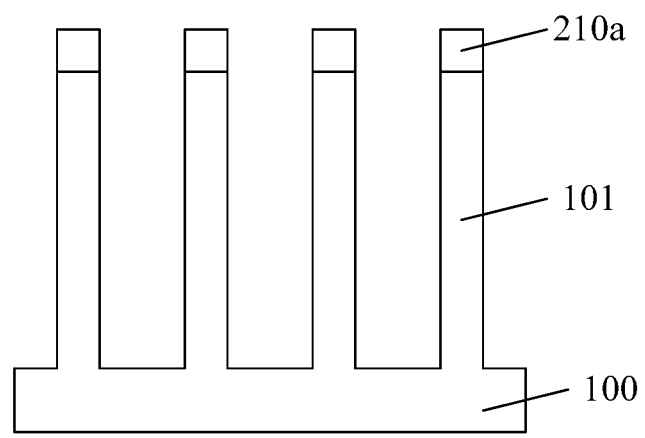

As shown in FIG. 21, at the beginning of the fabrication process, a substrate is formed (S101). FIGS. 7-12 illustrate the corresponding semiconductor device. FIG. 8 illustrates a cross-sectional view of the semiconductor device in FIG. 7 along the A-A' direction, and FIG. 9 illustrates a cross-sectional view of the semiconductor device in FIG. 7 along the B-B' direction.

As shown in FIGS. 7-12, a substrate 100 may be formed. First fins 110 and second fins 120 may be formed on the substrate 100. A first fin 110 may be disposed adjacent to a second fin 120. A first trench 211 may be formed between a first fin 110 and the adjacent second fin 120. A first mask layer 210 may be formed on the first fins 110 and the second fins 120.

The substrate 100 provides a fabrication platform for the subsequent semiconductor fabrication. Specifically, the first fins 110 and the second fins 120 may be formed on the substrate 100. In one embodiment, the substrate 100, the first fins 110, and the second fins 120 may be formed through etching a base substrate.

Figure 7:
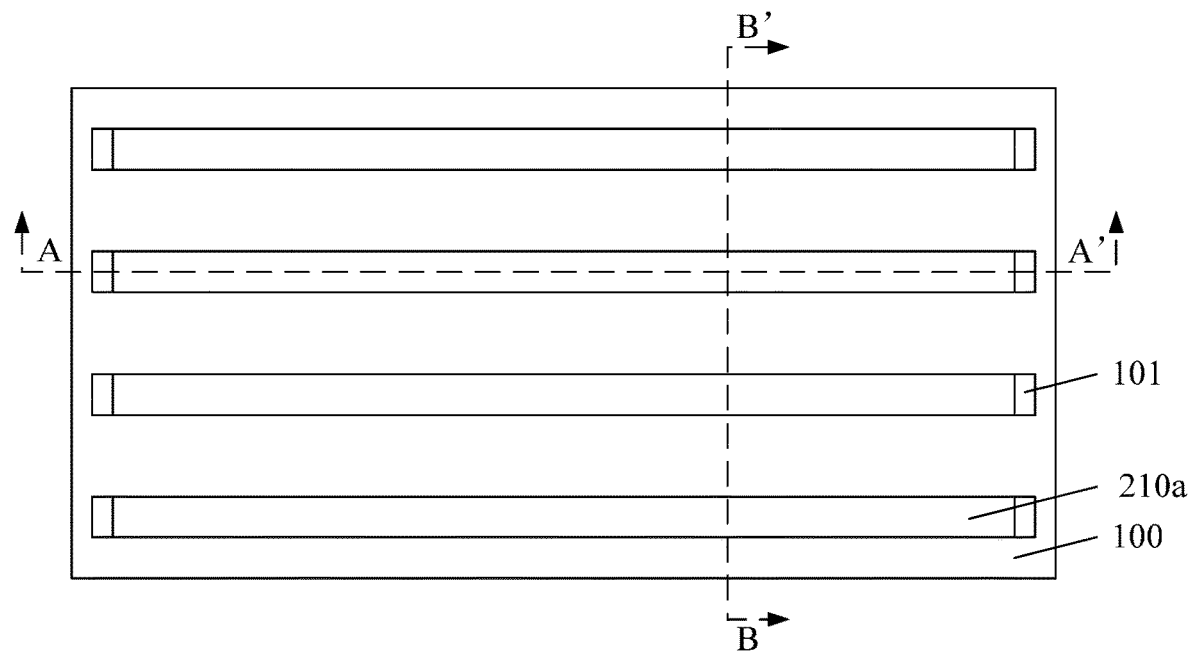
FIGS. 7-20 illustrate an exemplary semiconductor device corresponding to certain stages of an exemplary fabrication process consistent with various disclosed embodiments.

Specifically, as shown in FIG. 7, a base semiconductor substrate (not shown) may be provided. A second mask layer 210a, patterned, may be formed on the base semiconductor substrate.

The base semiconductor substrate is configured to provide a fabrication platform for the subsequent fabrication. The base semiconductor substrate is also used to form fins through etching. The base semiconductor substrate may be made of monocrystalline silicon, polysilicon, and/or amorphous silicon. In some embodiments, the base semiconductor substrate may also be made of silicon, germanium, gallium arsenide, silicon germanium, and/or other suitable semiconductor materials.

The specific materials for forming the base semiconductor substrate should not be limited by the embodiments of the present disclosure. In one embodiment, the base semiconductor substrate may be made of monocrystalline silicon. That is, the base semiconductor substrate, the first fins 110, and the second fins 120 may be made of monocrystalline silicon.

In some other embodiments of the present disclosure, the base semiconductor substrate may also include an epitaxial layer or may be a silicon-on-epi structure. Specifically, the base semiconductor substrate may include a base substrate and a semiconductor layer on the base substrate. The semiconductor layer may be formed through a suitable deposition process, e.g., selective epitaxial deposition, on the base substrate. The base substrate may be made of silicon, silicon germanium, silicon carbide, silicon-on-insulator, germanium-on-insulator, glass, III-IV compounds, and/or other suitable materials.

For example, the base substrate may be a gallium nitride substrate and/or a gallium arsenide substrate. The semiconductor layer may be made of silicon, germanium, silicon carbide, silicon germanium, and/or other suitable semiconductor materials. The specific choices of materials for forming the base substrate and the semiconductor layer should not be limited by the embodiments of the present disclosure. It is required that the base substrate should meet certain fabrication requirements, be easy to be integrated, and be suitable for forming fins. The thickness of the semiconductor layer may be controlled through the deposition process, e.g., an epitaxial deposition process. Thus, the thickness of the fins may be precisely controlled.

The patterned second mask layer 210a may be configured to define the locations and the dimensions of the fins. To fabricate the patterned second mask layer 210a, a second mask material layer may be formed on the base semiconductor substrate. A first patterned layer may be formed on the second mask material layer. The first patterned layer may be used as the etch mask to etch the second mask material layer until the base semiconductor substrate is exposed. The second mask layer 210a, patterned, may be formed. Specifically, in one embodiment, the second mask layer 210a may be made of silicon nitride.

In one embodiment, before forming the patterned second mask layer 210a, a buffer layer (not shown) may be formed on the base semiconductor substrate to reduce the lattice mismatch between the second mask layer 210a and the base semiconductor substrate. Specifically, in one embodiment, the buffer layer may be made of an oxide.

The first patterned layer may be a patterned photoresist layer, which may be formed through a coating process and a photolithography process. In addition, to reduce the feature sizes of the first fins and the second fins, and the distance between two adjacent fins, the first patterned layer may be formed through a multiple patterning process. For example, the multiple patterning process may include one or more of a self-aligned double patterning (SaDP) process, a self-aligned triple patterning (SaTP) process, and a self-aligned double double patterning (SaDDP) process.

As shown in FIGS. 8 and 9, the patterned second mask layer 210a may be used as the mask to remove some thickness of the base semiconductor substrate, to form the substrate 100 and the fin structures 101 on the substrate 100.

An anisotropic dry etching process may be used to remove or etch away some thickness of the base semiconductor substrate. Thus, the sidewalls of a fin structure 101 may be perpendicular or inclined with respect to the surface of the substrate 100. When the sidewalls of a fin structure 101 are inclined with respect to the surface of the substrate 100, the dimension of the bottom of the fin structure 101 may be greater than the dimension of the top of the fin structure 101. In one embodiment, the sidewalls of a fin structure 101 may be inclined with respect to the surface of the substrate 100.

When the fin structures 101 are being formed, damages and/or roughness may be formed on the base semiconductor substrate. To repair the damages and/or roughness on the base semiconductor substrate and improve the performance of the semiconductor device, a liner oxide layer may be formed. Specifically, in one embodiment, after the fin structures 101 are formed, a liner oxide layer (not shown) may be formed on the substrate 100 and the fin structures 101.

The liner oxide layer may smooth out the surface of the substrate 100 and the sharp corners of the fin structures 101. The line oxide layer may also be used as a buffer layer to reduce lattice mismatch between a subsequently-formed film and the substrate 100 with the fin structures 101. Specifically, a chemical vapor deposition and/or a thermal oxidation may be used to form the linear oxide layer. In certain other embodiments of the present disclosure, the liner oxide layer may not be formed, and an annealing process may be used to repair the substrate 100 and the fin structures 101. The specific processes or methods to repair the damages and the roughness on the substrate 100 and the fin structures 101 should not be limited by the embodiments of the present disclosure.

In one embodiment, four fin structures 101 aligned in parallel are formed on the substrate 100. However, the four fin structures 101 are only exemplary. The number of fin structures 101 formed on the substrate 100 should not be limited by the embodiments of the present disclosure.

Figure 10:
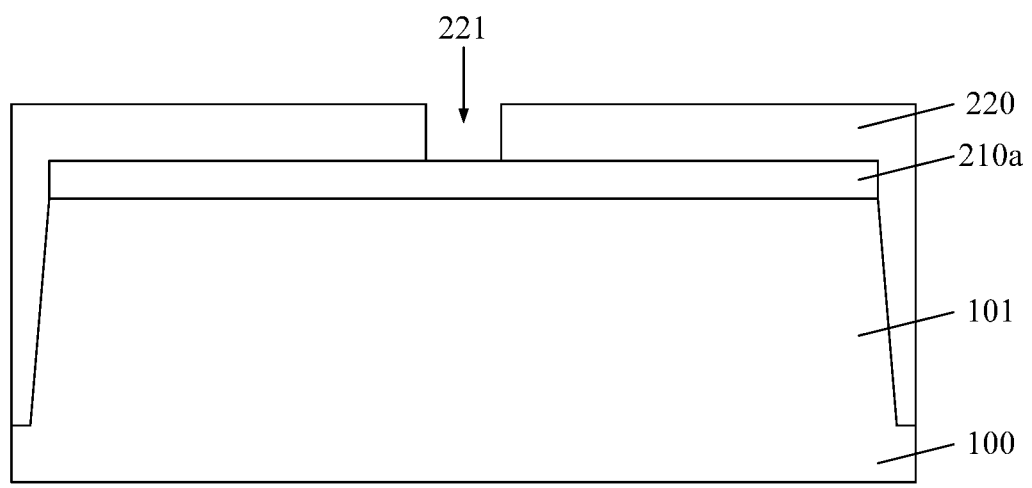
Figure 11:
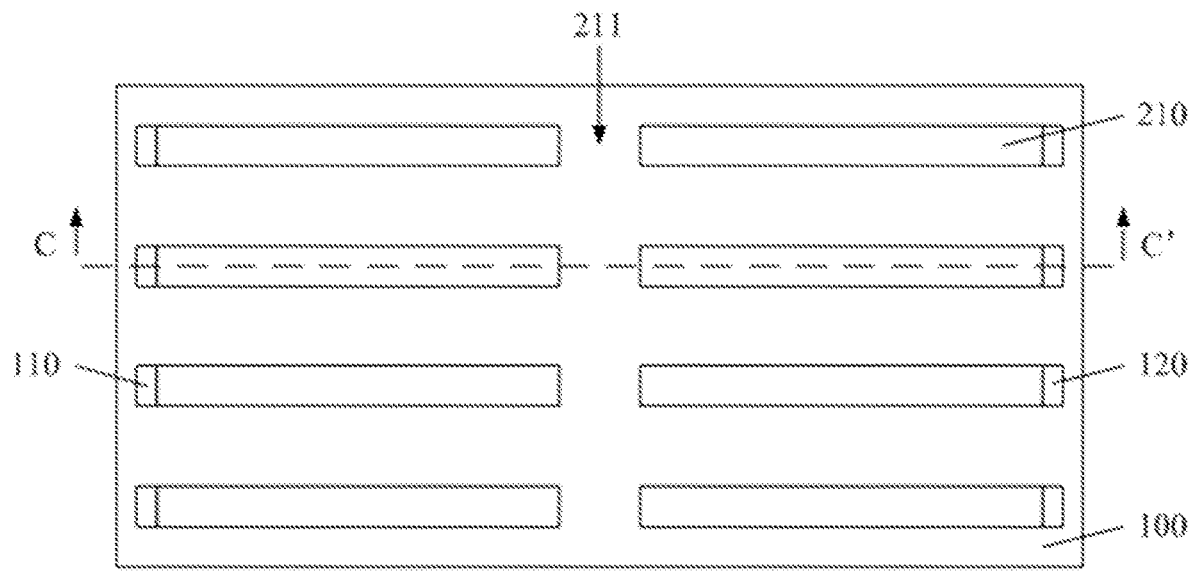
Figure 12:
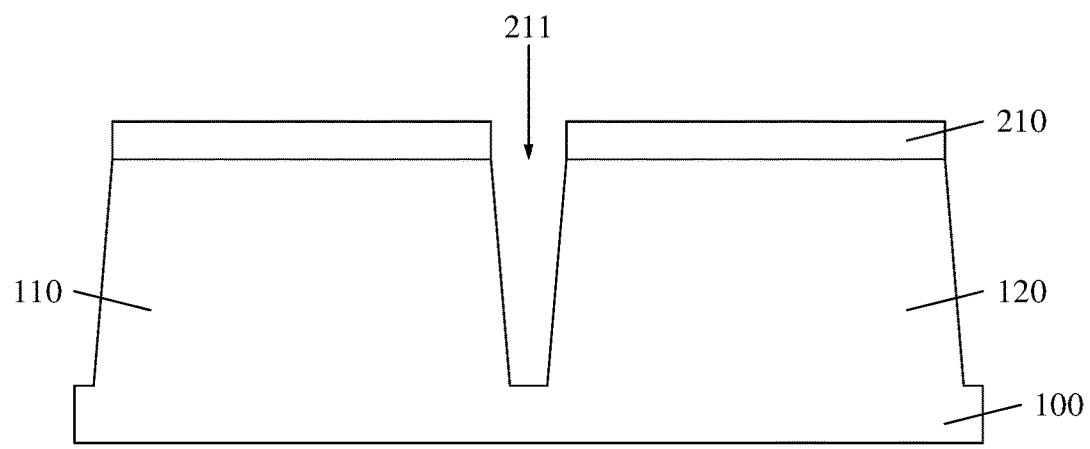

As shown in FIGS. 10-12, a first trench 211 may be formed in each fin structure 101. A first trench 211 may divide the fin structure 101 to a first fin 110 and a second fin 120.

Specifically, as shown in FIG. 10, a second patterned layer 220 may be formed to cover the substrate 100 and the second mask layer 210a. The second patterned layer 220 may include third openings 221. The third openings 221 may be configured to define the locations and dimensions of the first trenches 211.

Referring to FIGS. 11 and 12 (FIG. 12 is a cross-sectional view of the semiconductor device shown in FIG. 11 along the C-C' direction). The second patterned layer 220 may be used as a mask to etch the second mask layer 210 and the fin structures 101 to form a first trench 211 in each fin structure 101. The fin structure 101 may be divided into a first fin 110 and a second fin 120, adjacent to each other, by the corresponding first trench.

In one embodiment, the second patterned layer 220 may be a patterned photoresist layer, which may be formed through a coating process and a photolithography process.

The process to etch the second mask layer 210a and the fin structures 101 may be an anisotropic dry etching process. In this case, the sidewalls of a first trench 211 may be perpendicular or inclined with respect to the surface of the substrate 100. When the sidewalls of a first trench 211 are inclined with respect to the surface of the substrate 100, the dimension of the bottom of a first fin 110 may be greater than the dimension of the top of the first fin 110, and the dimension of the bottom of a second fin 120 may be greater than the dimension of the top of the second fin 120. In one embodiment, the sidewalls of a first trench 211 may be inclined with respect to the surface of the substrate 100.

In addition, when the fin structures 101 are formed, the sidewalls of a fin structure 101 may also be inclined with respect to the surface of the substrate 100. That is, the sidewalls of a first fin 110 and the sidewalls of a second fin 120 may also be inclined with respect to the substrate 100.

Referring to FIG. 12, a first mask layer 210 may be formed on the first fins 110 and the second fins 120. The first mask layer 210 may be configured to form first openings subsequently. The first mask layer 210 may also protect the first fins 110 and the second fins 120 during subsequent fabrication steps.

If the first mask layer 210 is too thin, it may be difficult for the first mask layer 210 to protect the first fins 110 and the second fins 120. If the first mask layer 210 is too thick, it may be wasteful or it may be more difficult to fabricate the first mask layer 210. In one embodiment, the thickness of first mask layer 210 may range between about 500 Å to about 1000 Å.

In one embodiment, a first trench 211 may be located in the corresponding fin structure 101, and the first trench may divide the corresponding second mask layer 210a into two first mask layers 210. To form the first mask layers 210, a second mask layer 210a may be divided into two first mask layers 210 by a first trench 211. The two first mask layers 210 may be disposed on a first fin 110 and a second fin 120, respectively. Specifically, because the second mask layer 210a may be made of silicon nitride, the first mask layers 210 may also be made of silicon nitride.

Dividing the second mask layer 210 using a first trench 211 to form the first mask layers 210 are only exemplary. In some other embodiments of the present disclosure, the second mask layer 210a may be removed after the first fins 110 and the second fins 120 are formed. The first mask layer 210 may be formed to cover the first fins 110 and the second fins 120. Thus, the processes to form the first mask layers 210 should not be limited by the embodiments of the present disclosure.

For illustrative purposes, four parallel fin structures 101 may be formed on the substrate 100. That is, four first fins 110 and four second fins 120 may be formed on the substrate 100. The adjacent first fins 110 may be parallel to each other. The adjacent second fins 120 may be parallel to each other. The arrangement of the first fins 110 and the second fins 120 is only exemplary and should not be limited by the embodiments of the present disclosure.

Figure 13:
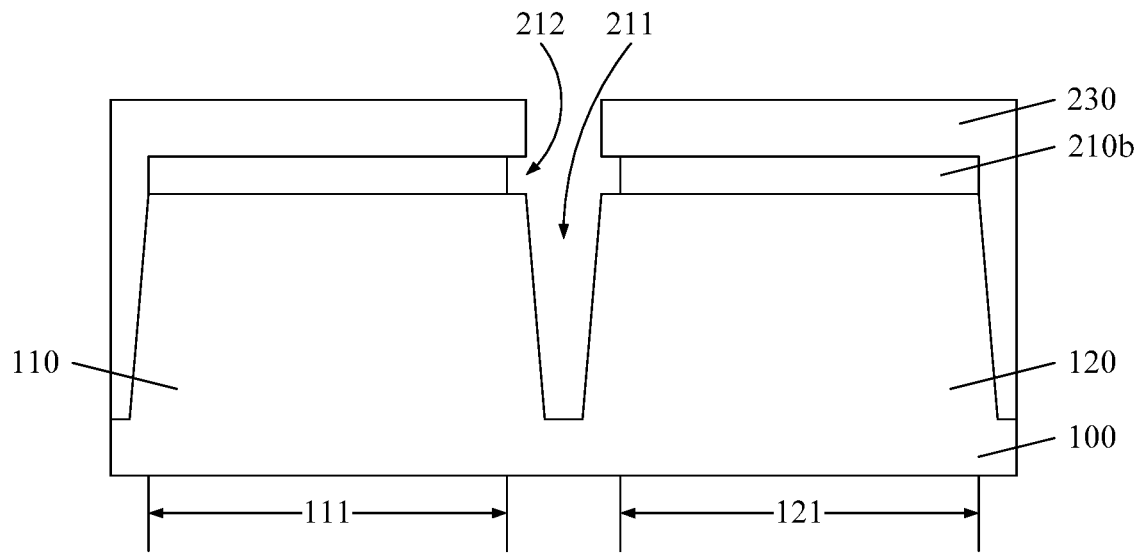

Returning to FIG. 21, after the substrate is formed, portions of the first mask layer neighboring a first trench are removed to form a first opening, the first opening exposing a portion of a first fin and a portion of the adjacent second fin, the remaining portions of the first mask layers covering first fin device regions and second fin device regions (S102). FIG. 13 illustrates a corresponding semiconductor device.

As shown in FIG. 13, portions of the first mask layer 210 neighboring a first trench 211 are removed to form a first opening 212, the first opening 212 exposing a portion of a first fin 110 and a portion of the adjacent second fin 120, the remaining portions of the first mask layers 210b covering first fin device regions 111 and second fin device regions 121.

Specifically, the process to remove portions of the first mask layer 210 neighboring a first trench 211 may include using a wet etching process to remove the portions of the first mask layer 210 neighboring a first trench 211 and expose a portion of the first fin 110 and a portion of the second fin 120. For example, in one embodiment, phosphoric acid may be used as the etchant to remove the portions of the first mask layer 210 neighboring a first trench 211.

Components of the semiconductor device may be formed in the first fin 110 and the second fin 120, covered by the remaining portions of the first mask layers 210b. Thus, the portion of the first fin 110 covered by a remaining portion of the first mask layer 210b may be referred as a first fin device region 111, and the portion of the second fin 120 covered by a remaining portion of the first mask layer 210b may be referred as a second fin device region 121.

Portions of the first mask layer 210, neighboring a first trench 211, may be removed in the following fabrication steps. First, a third mask layer 230 may be used for protection purposes. The third mask 230 may cover the substrate 100, the first fins 110, the second fins 120, and the first mask layer 210. The third mask layer 230 may not fill in the first trench 211 between a first fin 110 and the adjacent second fin 120. The third mask 230 may include an opening corresponding to the location of a first trench 211.

Further, a wet etching process may be used to remove portions of the first mask layer 210 neighboring a first trench 211 to expose a portion of the top surface of the first fin 110 and a portion of the top surface of the second fin 120. The remaining portions of the first mask layers 210b, the exposed portion of the top surface of the first fin 110, and the expose portion of the top surface of the second fin 120 may form a first opening 212.

Further, a dielectric material may be used to fill in the first trenches 211 and the corresponding first opening 212 to form a first insulating structure in the first opening 212 and the corresponding first trench 211. A first opening 212 may expose a portion of the first fin 110 and a portion of the second fin 120, thus a first insulating structure may cover the exposed portion of a first fin 110 and the exposed portion of a second fin 120.

Figure 14:
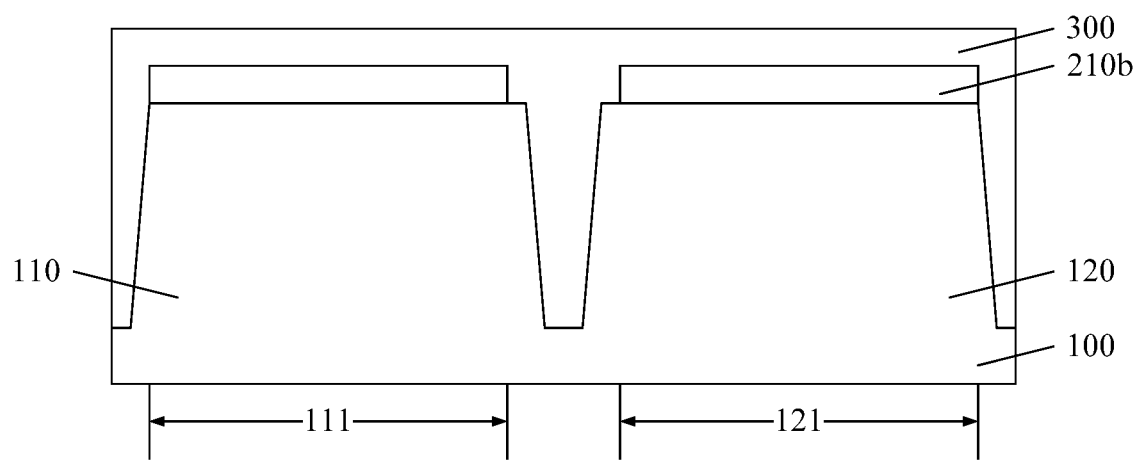
Figure 15:
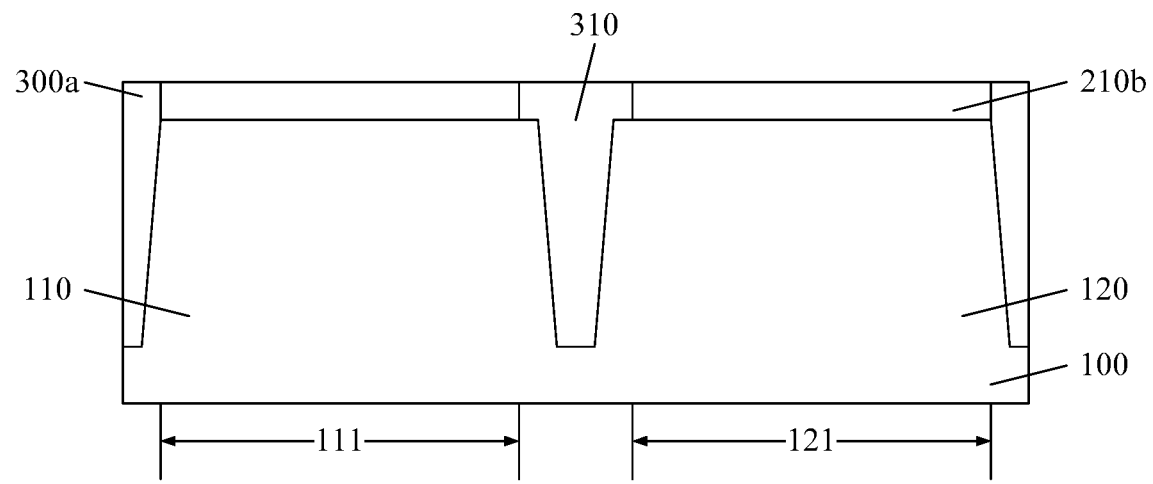

Returning to FIG. 21, after forming the first openings, first insulating structures are formed, a first insulating structure filling in a first trench and the corresponding first opening (S103). FIGS. 14 and 15 illustrate a corresponding semiconductor device.

As shown in FIGS. 14 and 15, first insulating structures 310 may be formed, a first insulating structure 310 filling in a first trench 211 and the corresponding first opening 212. FIGS. 14 and 15 illustrate a corresponding semiconductor device.

As shown in FIG. 14, an insulating material layer 300 may be formed on the substrate 100. The top surface of the insulating material layer 300 may be higher than the top surface of the remaining portions of the first mask layers 210b. The insulating material layer 300 may fill in the first trenches 211 and the first openings 212.

To increase device density, the width or dimension of a first trench between two adjacent fins may be sufficiently small, and the aspect ratio of a first trench, between two adjacent fins, may be sufficiently high. Thus, the insulating material layer 300 may fully fill the first trenches 211. A suitable deposition process may be used to form the insulating material layer 300. In one embodiment, a flowable chemical vapor deposition (FCVD) may be used to form the insulating material layer 300.

Specifically, to form the insulating material layer 300, a layer of precursors may be formed on the substrate 100 and the remaining portions of the first mask layer 210b. The precursors may be fluid. The top surface of the layer of precursors may be higher than the top surface of the remaining portions of the first mask layer 210b. An annealing process may be performed to solidify the precursors and form the insulating material layer 300.

In one embodiment, the precursors may be made of a silicon-containing fluid. The fluid may contain one or more polymers with Si—H bonds, Si—N bonds, and Si—O bonds. The precursors may be formed in a temperature ranging from about 60° C. to about 70° C. In one embodiment, the precursor may be formed in a temperature of about 65° C.

Because the precursors are in the form of fluid, the precursors may fully fill in the first trenches 211 and the first openings 212. That is, the insulating material layer 300, formed from the solidified precursors, may also fully fill in the first trenches 211 and the first openings 212. Because a first opening 212 exposes a portion of a first fin 110 and a portion of a second fin 120, the insulating material layer 300 may cover the exposed portion of the top surface of the first fin 110 and the exposed portion of the top surface of the second fin 120.

As shown in FIG. 15, some thickness of the insulating material layer 300 may be removed to expose the remaining portions of the first mask layer 210b. First insulating structures 310 may be formed.

Specifically, a chemical mechanical polishing process may be used to remove some thickness of the insulating material layer 300 at the top of the insulating material layer 300. The chemical mechanical polishing process may be stopped until the remaining portions of the first mask layer 210b are exposed. The first insulating structures 310 may be formed.

The portion of the insulating material layer 300, remained in a first trench 211 and the corresponding first opening 212, may form a first insulating structure 310. The top surface of a first insulating structure 310 may be coplanar with the top surfaces of the remaining portions of the first mask layer 210b. The portion of a first insulating structure 310 between a first fin 110 and a second fin 120 may provide electrical insulation between a first fin 110 and the adjacent second fin 120.

Because the insulating material layer 300 may cover the top surface of a portion of the first fin 110 and the top surface of a portion of the second fin 120, the portion of a first insulating structure 310 between two adjacent remaining first mask layers 210b may cover the top surface of a portion of the first fin 110 and the top surface of a portion of the second fin 120. Thus, the first fin 110 and the second fin 120 may be protected in subsequent fabrication steps. The stability and performance of the to-be-formed semiconductor device may be improved. The fabrication yield of the semiconductor fabrication may be improved.

Figure 16:
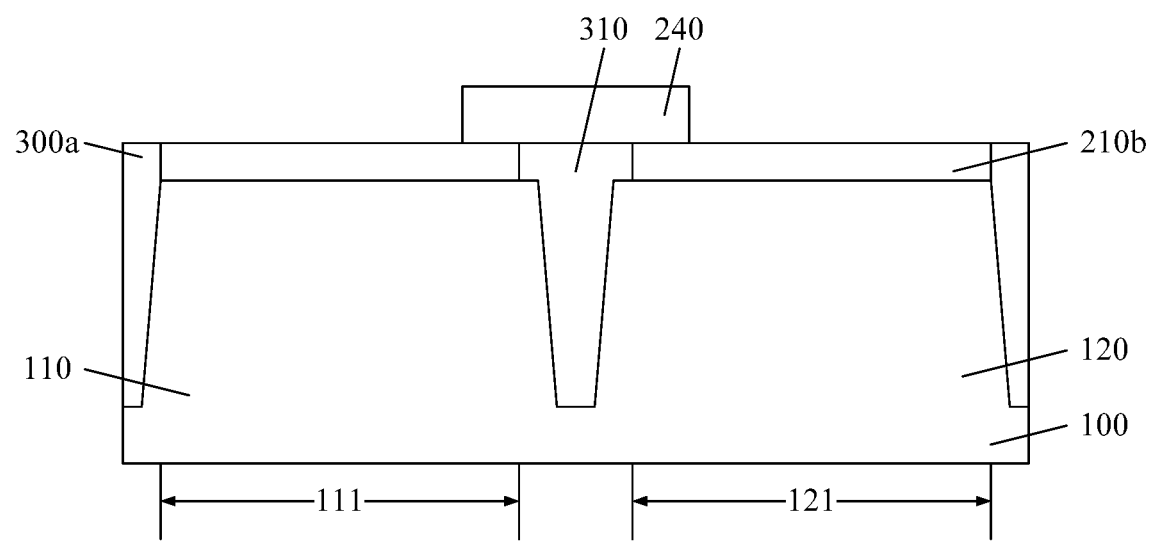
Figure 17:
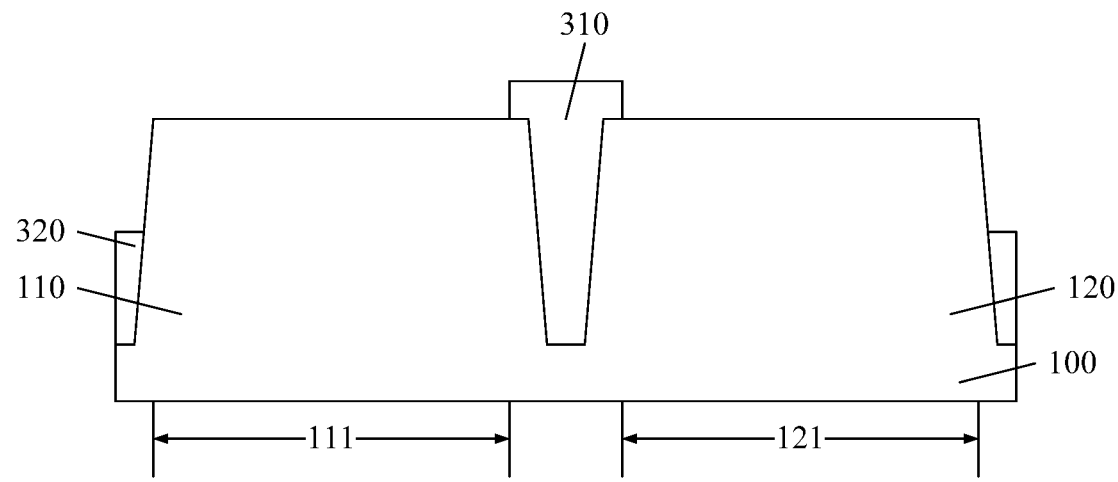
Figure 18:
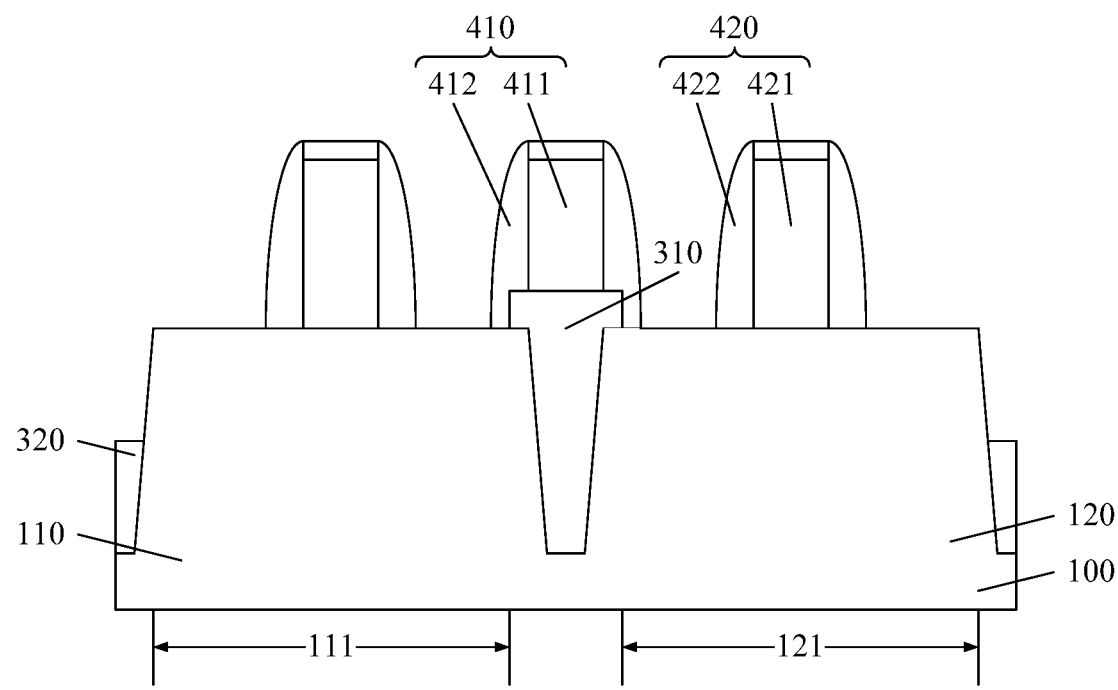

Returning to FIG. 21, after the first insulating structures are formed, a dummy gate structure is formed on a first insulating structure, and a gate structure is formed on each of the first fin device region and the second fin device region (S104). FIGS. 16-18 illustrate a corresponding semiconductor device.

As shown in FIGS. 16-18, a dummy gate structure 410 may be formed on a first insulating structure 310, and a gate structures 420 is formed on each of the first fin device region 111 and the second fin device region 121.

In one embodiment, the insulating material layer 300 may also cover the sides of a first fin 110 and the corresponding second fin 120. Thus, after the first insulating structures 310 are formed and before the dummy gate structures 410 are formed on the first insulating structures 310, some thickness of the insulating material layer 300 on the sides of a first fin 110 and the corresponding second fin 120 may be removed to expose the sidewalls of the first fin 110 and the second fin 120. The second insulating structures 320 may be formed.

To form the second insulating structures 320, as shown in FIG. 16, a fourth mask layer 240 may be formed to cover a first insulating structure 310. The fourth mask layer 240 may be configured to protect the first insulating structures 310 from being damaged when the second insulating structures 320 are being formed. Specifically, the fourth mask layer 240 may be made of photoresist. The fourth mask layer 240 may be formed through a coating process and a photolithography process.

In one embodiment, a fourth mask layer 240 may cover portions of corresponding remaining portions of the first mask layer 210b to improve the protection over the corresponding first insulating structure 310.

Further, after the first insulating structures 310 are formed and before the third mask layers 240 are formed, the thickness or height of a first insulating structure 310 may be reduced to increase the height of a dummy gate structure formed on a first insulating structure 310. The performance of the subsequently-formed semiconductor device may be improved. Specifically, an etch back process may be performed to decrease the thicknesses of the first insulating structures 310 and the remaining portions of the first mask layers 210b. The thickness of a first insulating structure 310 may be reduced.

As shown in FIGS. 16 and 17, an etch back process may be performed to remove some thickness of the insulating material layer 300a on the sides of a first fin 110 and the corresponding second fin 120 to expose the sidewalls of the first fin 110 and the second fin 120. The second insulating structures 320 may be formed.

The second insulating structures 320 may be configured to provide electrical insulation between the semiconductor device and other devices/parts. The top surface of a second insulating structure 320 may be lower than the top surfaces of the first fin 110 and the second fin 120 to expose the sidewalls of the first fins 110 and the second fins 120. Thus, the subsequently-formed gate structures may cover the sidewalls of the first fins 110 and the second fins 120 in a direction perpendicular to the C-C' direction.

As shown in FIG. 18, a dummy gate structure 410 may be formed on a first insulating structure 310, and a gate structure 420 may be formed on each of the first fin device region 111 and the second fin device region 121.

Before the dummy gate structures 410 are formed, the remaining portions of the first mask layer 210b may be removed to expose the first fin device regions 111 and the second fin device regions 121.

A dummy gate structure 410 may be configured to provide support in subsequent semiconductor fabrication steps, to avoid drastic fluctuations in the operation plane of the semiconductor fabrication. Specifically, a dummy gate structure 410 may include a dummy gate electrode 411 and dummy gate sidewall spacers 412 on the two sides of the dummy gate electrode 411.

To improve the protection of the first insulating structures 310 over the first fins 110 and the corresponding second fins 120, in one embodiment, dummy gate sidewall spacers 412 may also cover the sidewalls of the corresponding first insulating structure 310 to protect the first insulating structure 310 from being damaged in subsequent fabrication steps.

A first fin 110 and the corresponding second fin 120 may each be configured to form a FinFET. Raised source and drain region may be formed subsequently in the first fin 110 and the second fin 120. Thus, the gate structure 420 formed on a first fin device region 111 and the corresponding second fin device region 121 may be the gate structures 420 of the subsequently-formed FinFETs.

The FinFETs formed from the first fins 110 and the second fins 120 may each have a high-k metal gate (HKMG) structure. The FinFETs may be formed by a gate last process. Thus, the gate structures 420 on the first fin device regions and on the second fin device regions may also be used as the dummy gate structures for the metal gates of the FinFETs. In one embodiment, a gate structure 420 may include a gate electrode 421 and gate sidewall spacers 422 on the two sides of the gate electrode 421.

Thus, the gate structures 420 and the dummy gate structures 410 may be formed simultaneously or through same fabrication steps. Specifically, the dummy gate electrodes 411 and the gate electrodes 421 may be made of polysilicon. The dummy gate sidewall spacers 412 and the gate sidewall spacers 422 may be made of one or more of silicon dioxide, silicon nitride, and silicon oxynitride.

Figure 19:
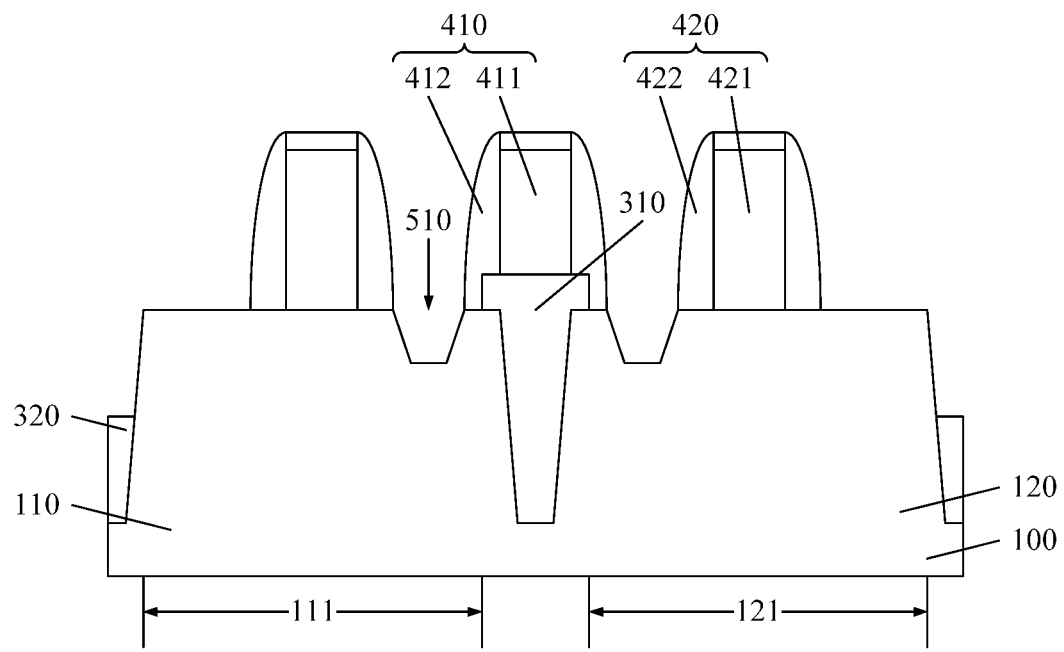

Returning to FIG. 21, after the dummy gate structures and the gate structures are formed, a stress layer may be formed in a first fin device region between a dummy gate structure and a gate structure and in a second fin device region between a dummy gate structure and a gate structure (S105). FIGS. 19 and 20 illustrate a corresponding semiconductor device.

Specifically, as shown in FIG. 19, a second trench 510 may be formed in a first fin device region 111 between a dummy gate structure 410 and a gate structure 420 and in a second fin device region 121 between a dummy gate structure 410 and a gate structure 420.

In one embodiment, a first fin 110 and the corresponding second fin 120 may each be configured to form P-type FinFETs. A subsequently-formed stress layer may be have a Sigma shape, and the second trench 510 may have a Sigma shape. A Sigma-shaped second trench 510 may include a protruding portion pointing to the channel region of the corresponding FinFET. Subsequently, when boron-containing silicon germanium is filled in a second trench 510 through epitaxial deposition, the boron-containing silicon germanium material may fully fill in the entire second trench 510. At the protruding region of a second trench 510, the boron-containing silicon germanium material may be located closer to the corresponding channel region and apply higher compressive strain on the channel region.

The fabrication process to form the Sigma-shape second trenches 510 may include the following steps. A plasma etching process may be performed. The etchant gas may include HBr, $O_2$, He, $Cl_2$, and $NF_5$. The gas flow of the HBr may range from about 100 sccm to about 1000 sccm. The gas flow of $O_2$ may range from about 2 sccm to about 20 sccm. The gas flow of He may range from about 100 sccm to about 1000 sccm. The gas flow of $Cl_2$ may range from about 2 sccm to about 200 sccm. The gas flow of $NF_5$ may range from about 2 sccm to about 200 sccm. The pressure of the etchant gas may range from about 10 mTorr to about 200 mTorr. The etching bias may range from about 0 V to about 400 V. The etching time may be about 5 seconds to about 60 seconds. After the plasma etching process, a wet etching process may be applied. The etchant of the wet etching process may include tetramethylammonium hydroxide (TMAH) solution, with a temperature of about 15° C. to about 70° C. The etching time may range from about 20 seconds to about 500 seconds. In some embodiments, the etchant of the wet etching process may also include potassium hydroxide solution and/or aqueous ammonia solution.

Because a first insulating structure 310 covers a portion of the top surface of the first fin 110 and a portion of the top surface of the second fin 120, the first fins 110 and the second fins 120 may be less susceptible to damages when the second trenches 510 are being formed. The shape and morphology of the second trenches 510 may be improved, and the subsequently-formed FinFETs may have improved performance.

As shown in FIG. 20, a semiconductor material may be filled in the second trenches 510 to form the stress layers 520.

In one embodiment, a first fin 110 and the corresponding second fin 120 may be used for forming P-type FinFETs. Thus, the semiconductor material filled in the second trenches 510 may be silicon germanium. The silicon germanium filled in a second trench may apply compressive strain to the channel region of the corresponding FinFET.

Specifically, an epitaxial deposition process may be performed to fill a semiconductor material into the second trenches 510 and form the stress layers 520. In addition, when silicon germanium is deposited through epitaxial deposition, P-type ions may be doped into the silicon germanium. For example, the P-type ions may be boron ions, and a selective epitaxial deposition may be used to form the stress layers 520. A Sigma-shaped second trench 510 may include a protruding portion pointing to the corresponding channel region. At the protruding region of a second trench 510, the boron-containing silicon germanium material may be located closer to the corresponding channel region and apply higher compressive strain on the channel region. Carrier mobility in the channel regions of the subsequently-formed FinFETs may be improved.

Further, the present disclosure provides a semiconductor device. The semiconductor device may include a substrate, the substrate including adjacent first fins and second fins. A first insulating structure may be located between a first fin and a second fin. A first insulating structure may cover a portion of the top surface of the first fin and a portion of the top surface of the second fin. The portion of a first fin not covered by the first insulating structure may be a first fin device region, and the portion of a second fin not covered by the first insulating structure may be a second fin device region. The semiconductor device may also include a dummy gate structure on the first insulating structure, and a gate structure on each of the first fin device region and the second fin device region. A stress layer in the first fin device region between a dummy gate structure and a gate structure, and a stress layer in the second fin device region between a dummy gate structure and a gate structure.

As shown in FIG. 20, an exemplary semiconductor device may be illustrated. Specifically, the semiconductor device may include a substrate 100. The substrate 100 may include adjacent first fins 110 and second fins 120.

The substrate 100 may be a platform for subsequent semiconductor fabrication. In one embodiment, the substrate 100, the first fins 110, and the second fins 120 may be formed through etching a base semiconductor substrate.

The base semiconductor substrate is configured to provide a fabrication platform for the subsequent fabrication. The base semiconductor substrate is also used to form fins through etching. The base semiconductor substrate may be made of monocrystalline silicon, polysilicon, and/or amorphous silicon. In some embodiments, the base semiconductor substrate may also be made of silicon, germanium, gallium arsenide, silicon germanium, and/or other suitable semiconductor materials. The specific materials for forming the base semiconductor substrate should not be limited by the embodiments of the present disclosure. In one embodiment, the base semiconductor substrate may be made of monocrystalline silicon. That is, the semiconductor substrate 100, the first fins 110, and the second substrate 120 may be made of monocrystalline silicon.

In some other embodiments of the present disclosure, the base semiconductor substrate may also include an epitaxial layer or may be a silicon-on-epi structure. Specifically, the base semiconductor substrate may include a base substrate and a semiconductor layer on the base substrate. The semiconductor layer may be formed through a suitable deposition process, e.g., selective epitaxial deposition, on the base substrate. The base substrate may be made of silicon, silicon germanium, silicon carbide, silicon-on-insulator, germanium-on-insulator, glass, III-IV compounds, and/or other suitable materials. For example, the base substrate may be a gallium nitride substrate and/or a gallium arsenide. The semiconductor layer may be made of silicon, germanium, silicon carbide, silicon germanium, and/or other suitable semiconductor materials. The specific choices of materials for forming the base substrate and the semiconductor layer should not be limited by the embodiments of the present disclosure. It is required that the base substrate should be suitable for fabrication requirements, be easy to be integrated, and be suitable for forming fins. The thickness of the semiconductor layer may be controlled through the deposition process, e.g., an epitaxial deposition process. Thus, the thickness of the fins may be precisely controlled.

The semiconductor device may also include a first insulating structure 310 located between a first fin 110 and the corresponding second fin 120. The first insulating structure 310 may cover a portion of the top surface of the first fin 110 and a portion of the top surface of the second fin 120. The portion of a first fin 110 not covered by the first insulating structure 310 may be a first fin device region 111, and the portion of a second fin 120 not covered by the first insulating structure 310 may be a second fin device region 121.

A first insulating structure 310 may be configured to provide electrical insulation between a first fin 110 and the corresponding second fin 120. The first insulating structure 310 may cover a portion of the top surface of the first fin 110 and a portion of the top surface of the second fin 120, so the first insulating structure 310 may protect the first fin 110 and the second fin 120 from being damaged during the semiconductor fabrication process. The stability and the performance of the semiconductor device may be improved. The fabrication yield of the semiconductor device may be improved.

In one embodiment, the semiconductor device may also include second insulating structures 320 on the two sides of a first fin 110 and the corresponding second fin 120. The top surface of a second insulating structure 320 may be lower than the top surfaces of the first fin 110 and the second fin 120 to expose the sidewalls of the first fin 110 and the second fin 120.

The second insulating structures 320 may be configured to provide electrical insulation between the semiconductor device and other parts/devices. The top surface of a second insulating structure 320 may be lower than the top surfaces of the first fin 110 and the second fin 120 to expose the sidewalls of the first fin 110 and the second fin 120, so that subsequently-formed gate structures may cover the sidewalls of the first fins 110 and the second fins 120, in a direction perpendicular to the C-C' direction.

In addition, the portions of the first fins 110 and the second fins 120 not covered by the first insulating structures 310 may be used to form components of the semiconductor device. The portion of a first fin 110 not covered by the first insulating structure 310 may be a first fin device region 111, and the portion of a second fin 120 not covered by the first insulating structure 310 may be a second fin device region 121.

The semiconductor device may further include a dummy gate structure 410 on the first insulating structure 310, a gate structure 420 on each of the first fin device region 111 and the second fin device region 121.

A dummy gate structure 410 may be configured to provide support in subsequent semiconductor fabrication steps, to avoid drastic fluctuations in operation plane of the semiconductor fabrication. Specifically, a dummy gate structure 410 may include a dummy gate electrode 411 and dummy gate sidewall spacers 412 on the two sides of the dummy gate electrode 411.

To improve the protection of the first insulating structures 310 over the first fins 110 and the second fins 120, in one embodiment, dummy gate sidewall spacers 412 may also cover the sidewalls of the corresponding first insulating structure 310 to prevent the first insulating structure 310 from being damaged in subsequent fabrication steps.

In one embodiment, a first fin 110 and the corresponding second fin 120 may each be configured to form a FinFET. Raised source and drain region may be formed subsequently in the first fin 110 and the second fin 120. Thus, the gate structures 420 formed on a first fin device region 111 and the corresponding second fin device region 121 may be the gate structures 420 of the subsequently-formed FinFETs.

It should be noted that, the FinFETs formed from a first fin 110 and a second fin 120 may each have a high-k metal gate (HKMG) structure. The FinFET may be formed by a gate last process. Thus, the gate structures 420 on the first fin device regions and on the second fin device regions may also be used as the dummy gate structures for the metal gates of the FinFETs.

In one embodiment, a gate structure 420 may include a gate electrode 421 and gate sidewall spacers 422 on the two sides of the gate electrode 421.

Thus, the gate structures 420 and the dummy gate structures 410 may be formed simultaneously or through same fabrication steps. Specifically, the dummy gate electrodes 411 and the gate electrodes 421 may be made of polysilicon. The dummy gate sidewall spacers 412 and the gate sidewall spacers 422 may be made of one or more of silicon dioxide, silicon nitride, and silicon oxynitride.

The semiconductor device may further include a stress layer 520 in the first fin device region 111 between a dummy gate structure 410 and a gate structure 420, and a stress layer 520 in the second fin device region 112 between a dummy gate structure 410 and a gate structure 420.

In one embodiment, a first fin 110 and the corresponding second fin 120 may each be configured to form a P-type FinFET. The stress layer 520 may be have a Sigma shape, and the stress layer 520 may be made of silicon germanium.

A Sigma-shaped stress layer 520 may include a protruding portion pointing to the channel region of the corresponding FinFET. The silicon germanium at the protruding portion may be closer to the channel region and may apply a higher compressive strain on the channel region. The carrier mobility in the channel region may be improved.

Because a first insulating structure 310 covers a portion of top surface of the first fin 110 and a portion of the top surface of the second fin 120, and the sidewalls of the first insulating structure 310 may cover the sidewalls of the gate structure 420, the first fins 110 and the second fins 120 may be less susceptible to damages when the second trenches 510 are being formed. The shape and morphology of the second trenches 510 may be improved, and the subsequently-formed FinFETs may have improved performance.

Compared to a conventional semiconductor fabrication method and a conventional semiconductor device, the disclosed semiconductor device and semiconductor fabrication method may have several advantages.

According to the present disclosure, portions of the first mask layer neighboring the first trench may be removed to form a first opening, the first opening exposing a portion of the first fin and a portion of the second fin. The first trench and the corresponding first opening may be filled to form a first insulating structure. Thus, the first insulating structure not only provides electrical insulation between a first fin and the adjacent second fin, but also covers a portion of the top surface of the first fin and a portion of the top surface of the second fin. The top surfaces of the first fin and the second fin neighboring the first trench would not be damaged when the stress layers are being formed. The shape and morphology of the shape layer can be improved, and the fabrication yield of the semiconductor device may be improved.

Further, in the embodiments of the present disclosure, after the first insulating structure is formed and before the second insulating structures are formed, the third mask layer covering the first insulating structure may be formed. The third mask layer may cover some of the remaining portions of the first mask layer. The third mask layer may protect the first insulating structure when the second insulating structures are formed so that the first insulating structure would not be damaged. Thus, when the stress layers are formed, the first insulating structure may cover a portion of the top surface of the first fin and a portion of the top surface of the second fin to protect the top surfaces of the first fin and the second fin.

Further, in the embodiments of the present disclosure, a dummy gate structure may include dummy gate sidewall spaces on two sides of the dummy gate. The dummy gate sidewall spacers may cover the sidewalls of the corresponding first insulating structure. The dummy gate sidewall spacers may protect the corresponding first insulating structure when the stress layers are formed. Thus, the protection functions of the first insulating structure would not be adversely affected by the fabrication process.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims.

What is claimed is:

1. A semiconductor device, comprising:
   a substrate, including first fins and second fins, a first fin being adjacent to a second fin;
   a first insulating structure located between the first fin and the adjacent second fin, the first insulating structure covering a portion of a top surface of the first fin and a portion of a top surface of the adjacent second fin, a portion of the first fin uncovered by the first insulating structure being a first fin device region and a portion of the second fin uncovered by the first insulating structure being a second fin device region;
   a dummy gate structure on the first insulating structure, and a first gate structure on the first fin device region, and a second gate structure on the second fin device region, wherein the dummy gate structure is symmetrical with regard to a center plane of the first insulation structure perpendicular to an extension direction of the first fins and a vertical line of symmetry of a shape of a dummy gate electrode of the dummy gate structure and a vertical line of symmetry of a shape of the first insulation layer are the same; and
   a first stress layer in the first fin device region between the dummy gate structure and the first gate structure, and a second stress layer in the second fin device region between the dummy gate structure and the second gate structure.

2. The semiconductor device according to claim 1, further including second insulating structures located on two sides of the first fin and the adjacent second fin, top surfaces of the second insulating structures being lower than top surfaces of the first fin and the adjacent second fin to expose sidewalls of the first fin and the adjacent second fin.

3. The semiconductor device according to claim 2, wherein the top surfaces of the second insulating structures being lower than the top surfaces of the first insulating structure.

4. The semiconductor device according to claim 1, wherein the dummy gate structure includes a dummy gate electrode and dummy gate sidewall spacers, the dummy gate sidewall spacers covering sidewalls of a corresponding first insulating structure.

5. The semiconductor device according to claim 4, wherein the dummy gate sidewall spacers further cover a portion of the top surface of the first insulating structure and sidewalls of the dummy gate electrode.

6. The semiconductor device according to claim 1, wherein the first fin and the second fin are each configured to form a P-type fin field effect transistor, the first and second stress layers being formed with boron-containing silicon germanium and including a protrusion portion pointing at a channel region of each P-type fin field effect transistor for applying a compressive strain on the channel region of the P-type fin field effect transistor.

7. The semiconductor device according to claim 1, wherein the first insulating structure has a shape with a high aspect ratio and is formed by a precursor including one or more polymers having Si—H bonds, Si—N bonds, and Si—O bonds.

8. The semiconductor device according to claim 1, wherein the first insulating structure is formed on the substrate.

9. The semiconductor device according to claim 1, wherein the insulating structure is made by an annealing process on a precursor made of a silicon-containing fluid.

10. The semiconductor device according to claim 1, wherein:
    the first insulating structure has a top portion formed directly on the top surface of the first fin and directly on the top surface of the second fin; and
    a vertical line of symmetry of a shape of the top portion of the first insulation layer and the vertical line of symmetry of the shape of the first insulation layer are the same.

11. A semiconductor device, comprising:
    a substrate, including a plurality of fins;
    an insulating structure, located between neighboring fins, on the substrate and having a portion on a first surface portion of a fin, wherein the fin has a second surface portion uncovered by the insulating structure;
    a dummy gate structure, on the insulating structure, wherein the dummy gate structure is symmetrical with regard to a center plane of the first insulation structure perpendicular to an extension direction of the first fins and a vertical line of symmetry of a shape of a dummy gate electrode of the dummy gate structure and a vertical line of symmetry of a shape of the first insulation layer are the same;
a gate structure, on the second surface portion of the fin; and
a stress layer, in the fin and between the gate structure and the dummy gate structure.

12. The semiconductor device according to claim 11, wherein:
the dummy gate structure includes a dummy gate sidewall spacer, covering a sidewall of the insulating structure and on the second surface portion of the fin.

13. The semiconductor device according to claim 11, wherein:
a same type of transistor is formed on each of the neighboring fins and includes a P-type fin field effect transistor, including the gate structure on the second surface portion of the fin.

14. The semiconductor device according to claim 11, wherein:
the stress layer is formed by a material including boron-containing silicon germanium.

15. The semiconductor device according to claim 11, wherein:
the stress layer includes a protrusion portion pointing to a channel region in the fin and under the gate structure.

16. The semiconductor device according to claim 11, wherein:
the insulating structure has a shape with a high aspect ratio and is formed by a precursor including one or more polymers having Si—H bonds, Si—N bonds, and Si—O bonds.

17. The semiconductor device according to claim 11, further including:
another insulating structure formed in the substrate and on an opposite sidewall of the fin with respect to the insulating structure.

18. The semiconductor device according to claim 17, wherein:
the another insulating structure has a top surface lower than the fin to expose a portion of the opposite sidewall of the fin with respect to the insulating structure.

* * * * *